Figure 1:
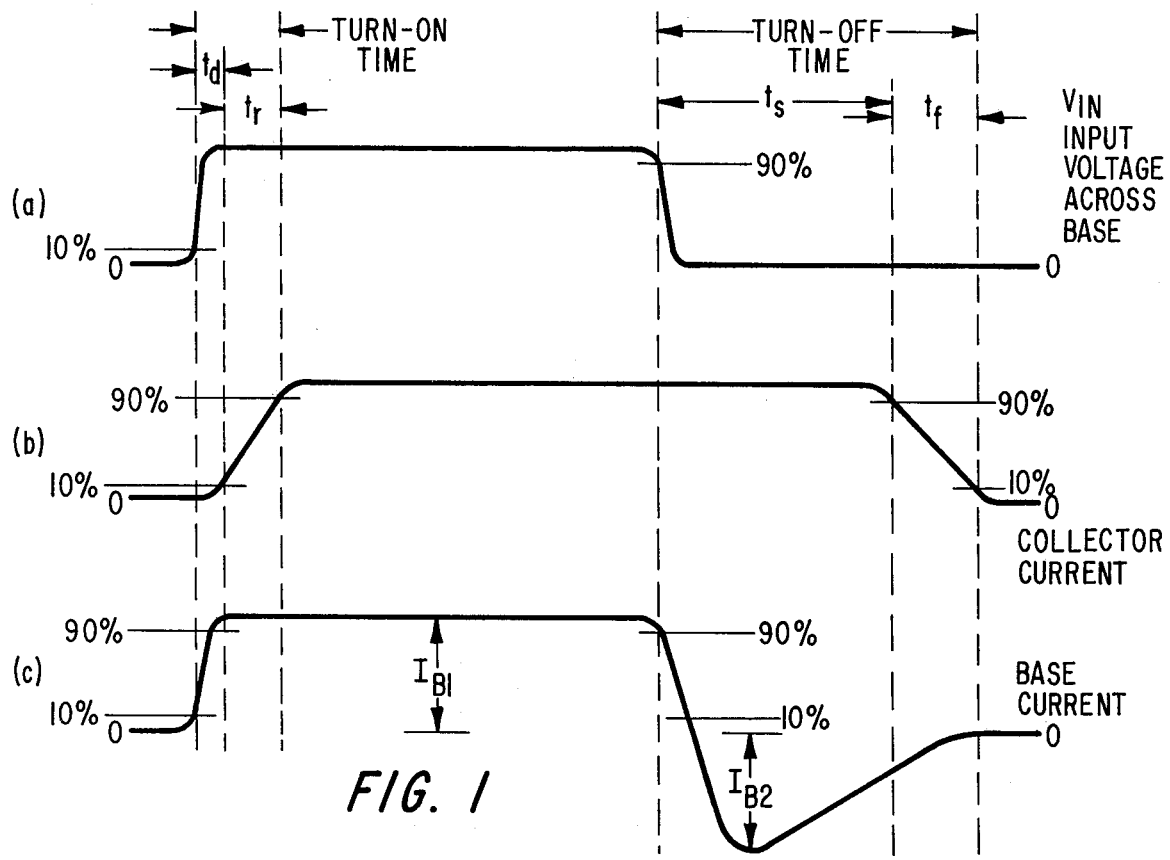

United States Patent [19]

Salvatore

[11] 4,010,418
[45] Mar. 1, 1977

[54] TRANSISTOR CIRCUITS

[75] Inventor: Leonard Robert Salvatore, Greenbrook, N.J.

[73] Assignee: RCA Corporation, New York, N.Y.

[22] Filed: Mar. 13, 1975

[21] Appl. No.: 558,147

[52] U.S. Cl. .......................... 324/158 T; 324/183; 324/186

[51] Int. Cl.² ........................................ G01R 31/26

[58] Field of Search ....... 324/158 T, 158 R, 158 D, 324/183, 184, 186

[56] References Cited

UNITED STATES PATENTS

| | | | |
|---|---|---|---|
| 3,286,180 | 11/1966 | Hubbs | 324/158 R |
| 3,359,491 | 12/1967 | McCutcheon | 324/158 R |

Primary Examiner—Rudolph V. Rolinec
Assistant Examiner—Ernest F. Karlsen
Attorney, Agent, or Firm—H. Christoffersen; Samuel Cohen; Kenneth Watov

[57] ABSTRACT

A circuit and method for indicating the rise time in switching a transistor on, and the fall time in switching the transistor off. A voltage is produced indicative of the transistor collector current and this voltage is compared with first and second reference voltage levels indicative of 10% and 90% of the maximum collector current. To measure rise time, a pulse counter is started when the 10% level is reached and stopped when the 90% level is reached. To measure fall time, a second pulse counter is started when the 90% level is reached and stopped when the 10% level is reached.

7 Claims, 2 Drawing Figures

TRANSISTOR CIRCUITS

The present invention relates generally to current measurement circuits, and more specifically to a circuit and method for indicating the rise time in switching a transistor on and the fall time in switching the transistor off.

In the prior art, the method of and circuits for measuring the rise and fall times of transistors switched between conductive and nonconductive states, have been generally complex. Certain of these prior art circuits require observation of waveforms upon an oscilloscope, in order to measure the various switching times characteristic of a particular device. Other of such circuits rely upon complex vacuum tube and transistor circuits to discriminate between the various switching times of a transistor, including pulse generators, waveform discriminators, amplifiers, and integrator networks, for operating a meter, such as an ammeter, calibrated in fractions of a second of interest.

With the development of high power and vary fast switching transistors, transistor switching time measuring circuits must be capable of measuring, for example, rise and fall times of about 25 nanoseconds (ns), while operating the transistors at collector electrode voltages in a range from about 150 volts to greater than 400 volts. The demands of volume testing also require that such measurement circuits provide easily observable readouts of the transistor switching times being measured.

Figure 2:
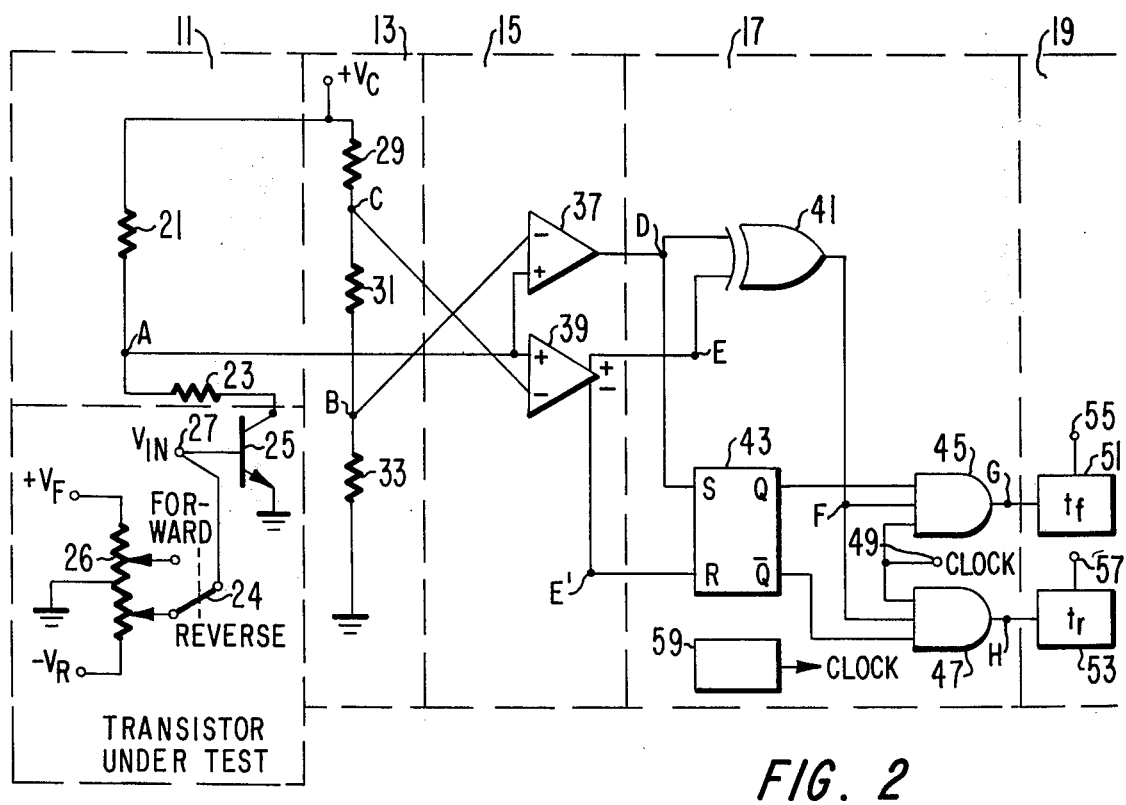

The invention is illustrated in the drawing of which:

FIG. 1 is a set of waveforms (a), (b), (c), showing the input voltage applied across the base electrode, the collector current, and the base current, respectively, of an NPN transistor operated as a common-emitter switch, when driven between conductive and nonconductive states; and FIG. 2 is schematic diagram of a preferred embodiment of the present invention.

There are delays when switching a bipolar transistor between nonconductive and conductive states. With reference to FIG. 1, for example, the "turn on" delay of such a transistor connected as a common-emitter switch, includes two time elements; the first $t_d$, designated the delay time, and the second $t_r$, the rise time. The delay $t_d$ is defined as the time interval between the 10% point of the increasing circuit input voltage waveform applied to the base electrode [FIG. 1(a)], and the 10% point of the increasing collector current waveform available at the collector electrode [FIG. 1(b)]. It is mainly caused by the reverse-bias voltage initially existing across the base-emitter junction capacitance, which capacitance must be discharged before it can attain the voltage signal level. In general, the greater the amplitude of the reverse-bias voltage applied to maintain the transistor cutoff, the longer this delay time. The delay time $t_d$ is also due to the time required for the emitter current to diffuse across the base region of the transistor.

The time interval between the 10% and 90% points of the increasing collector current waveform [FIG. 1(b)] is defined as the rise time ($t_r$). The rise time is a function of the alpha cutoff frequency of the transistor, and is indicative of the frequency response of the transistor. Also, the rise time is inversely proportional to the turn-on current magnitude. Accordingly, the turn-on time of the transistor is equal to the sum of the delay and rise times.

There is also a delay when switching such a transistor from its conducting to its nonconducting state. This "turn-off" delay time includes a storage time ($t_s$) defined as the time interval between the 90% point of the decreasing voltage waveform, and the 90% point of the decreasing collector current output waveform, and a fall time ($t_f$) defined as the interval between the 90% and 10% points of the decreasing collector current output waveform.

The storage time is a function of the common emitter current gain ($h_{FE}$) of the transistor, and the magnitude of the turn-on and turn-off currents, $I_{B1}$ and $I_{B2}$. The transistor is placed in a saturation condition when the collector voltage falls below the base voltage, causing the collector-base junction of the transistor to become forward biased, whereby the collector injects a charge into the base region. The collector current cannot decrease until the stored charges are swept out. The storage time is directly proportional to the magnitudes of the $h_{FE}$ and the turn-on drive, $I_{B1}$. The storage time is also directly proportional to the turn-off drive, $I_{B2}$.

The fall time is also indicative of the frequency response of the transistor and is inversely proportional to the magnitude of the turn-off drive. Accordingly, the turn-off time of the transistor is equal to the sum of the storage time and fall time ($t_s + t_f$).

In the above discussion of delay time associated with switching a transistor between conducting and nonconducting states, the threshold voltage ($V_{be}$) of the transistor is not considered. It is assumed that the input voltage or turn-on drive across the base is of much greater amplitude than the threshold voltage, causing the threshold voltage effect to be inconsequential. For meaningful measurement of the rise and fall times, they must be measured in relationship to specific turn-on and turn-off drives, due to their interdependence, as previously explained.

The circuit of FIG. 2, is for the purpose of measuring a number of the delays above. The circuit includes a first voltage divider circuit 11, a second voltage divider circuit 13, a comparator network 15, a digital logic network 17, and a pulse counting network 19.

The first voltage divider 11 includes a pair of resistors 21, and 23 connected in series between a supply of voltage +V $_c$ and the collector electrode of the transistor 25 under test. The emitter electrode of this transistor is connected to a point of reference potential, shown as ground, and its base electrode is connected to an input terminal 27.

The second voltage divider circuit 13 includes three resistors 29, 31, 33, connected in series between the supply of voltage +$V_c$ and ground.

The voltage comparator network 15 includes a first voltage comparator 37, and a second voltage comparator 39. The first voltage comparator 37 has an inverting input terminal connected to the common connection point B of resistors 31 and 33, a non-inverting input terminal connected to the common connection point A of resistors 21 and 23, and an output terminal. The second voltage comparator 39 has a non-inverting input terminal connected in common with the non-inverting input terminal of voltage comparator 37, an inverting input terminal connected to the common connection point C of resistors 29 and 31, a positive or non-inverting output terminal, and a negative or inverting output terminal.

Logic network 17 includes an EXCLUSIVE OR gate 41, a flip-flop 43, and a pair of three input AND gates 45, 47. EXCLUSIVE OR gate 41 has one input terminal connected in common to the output terminal of voltage comparator 37, and the SET(S) terminal of flip-flop 43, a second input terminal connected to the positive output terminal of voltage comparator 39, and an output terminal connected in common to a first input terminal of each of the AND gates 45 and 47. The RESET(R) terminal of flip-flop 43 is connected to the negative output terminal of the second comparator 39, its Q output terminal is connected to a third input terminal of AND gate 45, and its $\overline{Q}$ output terminal is connected to a third input terminal of AND gate 47. AND gates 45 and 47 each also have a second input terminal connected in common to a clock signal input terminal 49, receptive of clock pulses from a pulse generator 59.

The pulse counting network 19 includes a pair of pulse counters 51, 53. One of the pulse counters 53, designated the rise time counter ($t_r$), has a RESET terminal 57 and has an input terminal connected to the output terminal of AND gate 45. The other pulse counter 51, designated the fall time counter ($t_f$), has a RESET terminal 55 and an input terminal connected to the output terminal of AND gate 47.

The comparator network 15, logic network 17, and pulse counting network 19 of FIG. 2 are referenced to the supply voltage $+V_c$. Since power transistors typically operate with a collector voltage $V_c$ in the range of about 150 volts to 400 volts, if the comparator network 15, for example, is referenced to ground, voltage comparators 37 and 39 could be damaged or destroyed whenever the transistor 25 is made non-conductive. By referencing all signal levels to the supply voltage $+V_c$, this problem is avoided, in that when transistor 25 is cutoff, the voltage at point A with respect to the $+V_c$, will be zero. Of course, the circuit can be referenced to ground, if only low power transistors are to be tested for $t_r$ and $t_f$.

The maximum magnitude of collector current of transistor 25 is predetermined by the values of resistors 21 and 23, the beta of transistor 25, and the amplitudes of the forward bias input voltage applied across input terminal 27 and ground, and the supply voltage $+V_c$.

The value of resistor 33 is chosen to provide a voltage drop across resistors 29 and 31, which is equal to the voltage drop across resistor 21 when transistor 25 is placed in a predetermined conduction state. The value of resistor 29 is chosen to provide a voltage drop across resistor 29 that is equal to 10% of the voltage drop across resistor 21, when transistor 25 is in its predetermined conduction state. Similarly, the value of resistor 31 is chosen to provide a voltage drop across resistors 29 and 31 that is equal to 90% of voltage drop across resistor 21, with transistor 25 in its predetermined conduction state.

Resistor 21 may be viewed as a sensing resistor, for providing a sense voltage at A having an amplitude proportional to the collector current flowing through transistor 25. It follows that the voltage drops across resistor 29 and across resistors 29 and 31 are proportional to 10% and 90% of the maximum collector current magnitude, respectively, for the predetermined conduction state of transistor 25.

A switch 24, which in practice is an electronic switch, is connected between input terminal 27 and taps of a tapped resistor 26. The ends of the tapped resistor 26 are connected to a positive voltage $+V_f$ and a negative voltage $-V_r$, respectively. The centertap of the resistor 26 is connected to ground. The switch 24 has two operable positions, a forward position and a reverse position. Predetermined positive and negative voltages are applied across the base and emitter electrodes of transistor 25, when switch 24 is placed in the forward and reverse positions, respectively.

To measure rise time $t_r$, the transistor 25 is initially cutoff by placing switch 24 in its reverse position, whereby a reverse bias voltage is applied across the base and emitter electrodes of transistor 25. During this initial state, no current will flow through the first voltage divider 11, and therefore the voltage at point A will be equal to zero with reference to $+V_c$.

During the time transistor 25 is off, the output signal D of the first voltage comparator 37 is low, as is the output signal E at the positive output terminal of the second voltage comparator 39. As D and E are both low, EXCLUSIVE OR gate 41 produces a low output F. Flip-flop 43 is reset, having been placed in this state by output signal E' at the negative output terminal of the second voltage comparator 39. AND gates 45 and 47, are disabled by the low signal at F from the EXCLUSIVE OR gate 41. Counters 51 and 53 are in their reset states, having been previously reset by reset signals applied to terminals 55 and 57, respectively.

Transistor 25 is placed into a predetermined conduction state by placing switch 24 in its forward position, whereby a known forward bias input voltage is applied between input terminal 27 and ground. The input voltage amplitude is substantially greater than the $V_{be}$ of transistor 25, insuring that transistor 25 is switched well into conduction. As previously explained, with reference to FIG. 1, there will be a turn-on delay time in switching transistor 25 into conduction, comprising the sum of a delay time $f_d$ and a rise time $t_r$.

As transistor 25 begins to turn on, its collector current begins to increase towards some maximum value. When the collector current attains a magnitude that exceeds 10% of its maximum magnitude, the voltage at point A becomes greater than the voltage at point C. As a result, the output signals from the second voltage comparator 39 change their values, becoming high at point E and low at E'. The EXCLUSIVE OR gate 41 now receives a high signal at E and a low signal at D so that its output F goes high. Accordingly, AND gate 47 becomes primed (both $\overline{Q}$ and F are high) and it passes clock pulses from the input terminal 49 to the counter 53. Counter 53 counts these pulses.

The collector current continues to increase and when it attains a magnitude just in excess of 90% of its maximum magnitude, the voltage at point A will exceed the voltage at point B. In response to this voltage condition, the first voltage comparator 37 toggles to provide a high output signal at point D. This sets flip-flop 43 so that Q goes high and $\overline{Q}$ goes low. Also, since D and E are both high, the output signal F of the EXCLUSIVE OR gate 41 goes low. The first one of $\overline{Q}$ and F which goes low, disables AND gate 47 preventing further clock signals from reaching counter 53. The total count now indicated by counter 53 is indicative of the rise time $t_r$.

The fall time measurement can be made any time after transistor 25 has been placed into a predetermined conduction state, and the collector current has attained its maximum magnitude. The signal and logic states of the circuit are as described previously, for the condition where the collector current has attained a magnitude just in excess of 90% of its maximum magnitude.

Fall time measurement is initiated by placing switch 24 in the reverse position, thereby removing the forward-bias voltage from across the input terminal 27 and ground, and substituting therefore a reverse-bias voltage. The magnitude of the reverse-bias voltage must be predetermined for, as previously mentioned, the fall time is inversely proportional to this magnitude.

Transistor 25 will begin to turn off as its stored charges are dissipated, as previously explained. When the collector current falls in magnitude to just below 90% of its maximum magnitude, the output signal of comparator 37 will go low at D. In turn, the output signal from the EXCLUSIVE OR gate 41 will go high at F. As D and Q are both high, AND gate 45 is primed and passes clock signals to the fall time counter 51. The fall time counter 51 counts these signals.

When the collector current falls in magnitude to a value just below 10% of its maximum magnitude, comparator 39 will change state to provide a low output signal at E, and a high output signal at E'. The low signals now present at E and D disable EXCLUSIVE OR gate 41 and F goes low. The high signal E' resets flip-flop 43 so Q goes low. The first occurring of Q and F which goes low disables AND gate 45, and prevents further clock signals from being fed to the fall time counter 51. The total count indicated by counter 51 is indicative of the fall time $t_f$ of transistor 25.

To reinitiate the measurement of the rise and fall times of transistor 25 or another transistor substituted therefore, all that is required is that a reset signal be applied to each of the reset terminals 55, 57 of the counters 51, 53, respectively. The above described cycle of measurement is then repeated.

In a preferred form of the invention, sensing resistor 21 is much smaller in value than collector resistor 23. This reduces errors caused by variations, during a test run, in the collector-emitter voltage of the transistor 25 under test, and also by variations in the same parameter from one such transistor 25 to another. The circuit also is relatively insensitive to variations in $V_c$ because the two voltage dividers 11 and 13 form a bridge network, both branches of which are affected in the same way by such variations.

What is claimed is:

1. A transistor test circuit for measuring the time required for the current passing through the conduction path of a transistor to pass from a first to a second value when the transistor is switched from a nonconducting to a conducting state and for measuring also the time required for this current to pass from the second to the first value when the transistor is switched from its conducting to its nonconducting state comprising, in combination:
    means for translating said current to a voltage proportional thereto;
    means for providing first and second reference voltage levels indicative of said first and second values, respectively, of said current;
    comparator means respective of said first and second voltage levels and of said voltage proportional to current for producing a first signal manifestation in response to said voltage being lower than said first level, a second signal manifestation in response to said voltage reaching said first level, and a third signal manifestation in response to said signal reaching said second level;
    first and second counter means, each for counting at a given rate when turned on;
    means for providing clock signal pulses;
    AND gate means having at least one input terminal receptive of said clock signals; and
    means responsive to the order of occurrence of said first, second, and third signal manifestations, for priming said AND gate means to deliver clock pulses to said first counter, whenever said second signal manifestation follows said first signal manifestation, and thereafter disabling said AND gate means when said third signal manifestation is attained, and for priming said AND gate means to deliver pulses to said second counter, whenever said second signal manifestation follows said third signal manifestation, and thereafter disabling said AND gate means when said first signal manifestation is attained.

2. The circuit of claim 1, wherein said transistor is a bipolar transistor having an emitter electrode, and a collector electrode, and said conduction path is the emitter-collector electrode current path.

3. The circuit of claim 1, wherein, in combination, said AND gate means includes:
    first and second AND gates each having an output terminal connected to an input terminal of said first and second counter means, respectively, a first input terminal receptive of said clock signal pulses, and second and third input terminals; and
    said responsive means including:
    an EXCLUSIVE OR gate having an output terminal connected in common to the second input terminals of said first second AND gates, and a pair of input terminals; and
    a flip-flop having $\bar{Q}$ and Q output terminals connected individually to said first and second AND gates, respectively, and a pair of input terminals;
    said pair of input terminals of each one of said EXCLUSIVE OR gate and flip-flop being receptive of said first signal manifestation in such manner to reset said flip-flop and disable said first and second AND gates, of said third signal manifestation in such manner to set said flip-flop and disable said first and second AND gates, and of said second signal manifestation in such manner to prime said first AND gate, while maintaining said second AND gate disabled, whenever said second signal manifestation follows said first signal manifestation, or to prime said second AND gate, while maintaining said first AND disabled, whenever said second signal manifestation follows said third signal manifestation.

4. The circuit of claim 1, wherein said comparator means includes:
    first and second voltage comparators, each having a non-inverting input terminal receptive of said voltage proportional to said current, and an inverting input terminal individually receptive of said first and second reference voltages, respectively;
    said first voltage comparator also having an output terminal individually connected to said logic circuit means, for providing a "low" signal whenever said voltage proportional to said current is lower than said first level, and a "high" signal whenever said voltage is greater than said first level;

said second voltage comparator also having a positive and a negative output terminals individually connected to said logic means, for providing "low" and "high" output signals respectively, whenever said voltage is lower than said second level, and converse output signals whenever said voltage is greater than said second level.

5. The circuit of claim 3, wherein said logic circuit means includes:
and EXCLUSIVE OR gate having a first input terminal connected to said output terminal of said first comparator, a second input terminal connected to the positive output terminal of said second comparator, and an output terminal;
a flip-flop having a "SET" terminal connected to the output terminal of said first comparator, a "RESET" terminal connected to the negative output terminal of said second comparator, and "Q" and "$\overline{Q}$" output terminals;
means for providing clock signal pulses;
first and second AND gates each having a first input terminal connected in common to the output terminal of said EXCLUSIVE OR gate, a second input terminal commonly receptive of clock signal pulses from said clock signal means, a third input terminal individually connected to said Q and $\overline{Q}$ terminals of said flip-flop, respectively, and an output terminal connected individually to said first and second counter means, respectively.

6. The circuit of claim 1, wherein said translating means and said means for providing first and second reference voltages form first and second branches of a bridge network, respectively, comprising:
a source of voltage;
a point of reference potential;
said transistor having a collector electrode, and an emitter electrode connected to said point of reference potential, said collector and emitter electrodes forming said conduction path of said transistor;
a first resistive voltage divider connected between said source of voltage and said collector electrode, serving as said translating means; and
a second resistive voltage divider connected between said source of voltage and said point of reference potential, serving as said means for providing first and second reference voltage levels;
said bridge network ensuring that said voltage proportional to said current, and said first and second reference voltage levels are proportionally effected by variations in the amplitude of said source of voltage, thereby substantially reducing errors in the comparsion of said first and second voltage levels with said voltage proportional to said current.

7. The circuit of claim 1, wherein said voltage proportional to said current, said first and second reference voltage levels, said comparator means, and first and second counter means, and said logic circuit means, are each referenced to a source of voltage supplying power to said circuit, for permitting the measurement of the rise and fall times of power transistors operating at substantially high values of collector voltage.

* * * * *

UNITED STATES PATENT OFFICE
CERTIFICATE OF CORRECTION

PATENT NO. : 4,010,418

DATED : March 1, 1977

INVENTOR(S) : Leonard R. Salvatore

It is certified that error appears in the above-identified patent and that said Letters Patent are hereby corrected as shown below:

Column 1, line 22, "vary" should be --very--

Column 4, line 37, "$f_d$" should be --$t_d$--

Signed and Sealed this

Seventeenth Day of May 1977

[SEAL]

Attest:

RUTH C. MASON
*Attesting Officer*

C. MARSHALL DANN
*Commissioner of Patents and Trademarks*